United States Patent [19]

Metzger et al.

[11] Patent Number: 5,365,077

[45] Date of Patent: Nov. 15, 1994

[54] GAIN-STABLE NPN HETEROJUNCTION BIPOLAR TRANSISTOR

[75] Inventors: Robert A. Metzger, Thousand Oaks; Madjid Hafizi, Santa Monica; William E. Stanchina; Loren G. McCray, both of Thousand Oaks, all of Calif.

[73] Assignee: Hughes Aircraft Company, Los Angeles, Calif.

[21] Appl. No.: 7,695

[22] Filed: Jan. 22, 1993

[51] Int. Cl.$^5$ .................... H01L 29/72; H01L 29/205
[52] U.S. Cl. ......................... 257/15; 257/23; 257/197; 257/198
[58] Field of Search .................... 207/197, 198, 15, 23

[56] References Cited

U.S. PATENT DOCUMENTS 5,162,243 11/1992 Streit et al. .

FOREIGN PATENT DOCUMENTS 504925 8/1993 European Pat. Off. .
4251934 9/1992 Japan .................................. 257/197

OTHER PUBLICATIONS

Malik, et al., "High-gain, high frequency AlGaAs/-GaAs graded band-gap base bipolar transistors with a be diffusion set back layer in the base", *Applied Physics Letters*, vol 46, p. 600, (1985).

Jalali et al., "Near-ideal lateral scaling in abrupt AlInAs.InGaAs heterostructure bipolar transistors prepared by molecular beam epitaxy", *Applied Physics Letters*, vol. 54, p. 2333, (1989).

Jensen et al., "AlInAs/GaInAs HBT Ic Technology", *IEEE Journal of Solid-State Circuits*, vol. 26, No. 3, Mar. 1991, pp. 415–421.

Nottenburg et al., "In P-Based Heterostructure Bipolar Transistor", Proc. of the 1989 GaAs IC Symposium, 1989, pp. 135–138.

Capasso et al., "Pseudo-quaternary GaInAsP semiconductors: A new $Ga_{0.47}In_{0.53}As$/InP graded gap superlattice and its applications to avalanche photodiodes", *Applied Physics Letters*, vol. 45, No. 11, 1 Dec. 1984, pp. 1193–1195.

Wada et al., "Very high speed GaInAs metal-semiconductor-metal photodiode incorporating an AlInAs/-GaInAs graded superlattice", *Applied Physics Letters*, vol. 54, No. 1, 2 Jan. 1989, pp. 16–17.

Won et al., "Self-Aligned $In_{0.52}Al_{0.48}As/In_{0.53}Ga_{0.47}As$ Heterojunction Bipolar Transistors with Graded Interface on Semi-Insulating InP Grown by Molecular Beam Epitaxy", *IEEE Electron Device Letters*, vol. 10, No. 3, Mar. 1989, pp. 138–140.

Asbeck et al., "InP-based Heterojunction Bipolar Transistors: Performance Status and Circuit Applications", Second Int'l. Conf. on Indium Phophide and Related Mateials, Apr. 23–25, 1990, pp. 2–5.

Low-Temperature Characterization of High-Current-Gain Graded-Emitter AlGaAs/GaAs Narrow-Base Heterojunction Bipolar Transistor, K. Ikossi-Anastasiou et al, IEEE Electron Device Letters 13 (1992) Aug., No. 8, New York, US.

Translation of Jpn. Pat. Appln. Kokai Publication No. 4-251934, Fujitsu Sep. 8, 1992.

*Primary Examiner*—Jerome Jackson
*Attorney, Agent, or Firm*—V. D. Duraiswamy; W. K. Denson-Low

[57] ABSTRACT

A gain-stable npn heterojunction bipolar transistor includes a graded superlattice between its base and emitter consisting of multiple discrete periods, with each period having a layer of base material and another layer of emitter material. The thicknesses of the base material layers decrease while the thicknesses of the emitter material layers increase in discrete steps for each successive period from the base to the emitter. The thickness of each period is preferably at least about 20 Angstroms, with the superlattice including more than five periods. The superlattice is preferably doped to establish an electrical base-emitter junction at a desired location. The graded superlattice inhibits the diffusion of beryllium p dopant from the base into the emitter during transistor operation, thus stabilizing the device's gain and turn-on voltage.

17 Claims, 3 Drawing Sheets

| | | | |
|---|---|---|---|
| 36 — 1000Å | GaInAs CONTACT | $n=1\times10^{19}$ |
| 34 — 700Å | AlInAs EMITTER CONTACT | $n=1\times10^{19}$ |
| 32 — 1200Å | AlInAs EMITTER | $n=8\times10^{17}$ |
| 30 { | 233Å $n=8\times10^{17}$ | |
| | 67Å $p=2\times10^{18}$ | |
| 28 — 100Å | GaInAs SPACER | $p=2\times10^{18}$ |
| 26 — 500Å | GaInAs BASE | $p=3\times10^{19}$ |
| 24 — 3000Å | GaInAs COLLECTOR | $n=1\times10^{16}$ |
| 22 — 7000Å | GaInAs SUBCOLLECTOR | $n=1\times10^{19}$ |
| 20 — 100Å | GaInAs BUFFER | UNDOPED |
| 18 — | InP SUBSTRATE | |

GAIN-STABLE NPN HETEROJUNCTION BIPOLAR TRANSISTOR

BACKGROUND OF THE INVENTION

1. Field of the Invention

This invention relates to heterojunction bipolar transistors (HBTs) with a graded superlattice between the base and emitter.

2. Description of the Related Art

HBTs represent a field of increasing interest because of their potential for higher emitter efficiency, decreased base resistance, less emitter current crowding, improved frequency response and wider temperature range of operation. A representative HBT is illustrated in FIG. 1. It includes a semi-insulating semiconductor substrate 2, typically InP or GaAs. A highly doped n+ subcollector layer 4 on the substrate provides an underlying contact with the more lightly n− doped collector layer 6, with a metallized or highly doped semiconductor pad 8 providing a collector contact through the subcollector. A p+ base layer 10 is formed over the collector, with an n doped emitter 12 over the central portion of the base and a lateral base contact 14 surrounding the emitter. An emitter contact 16 is provided on the emitter's upper surface.

During the operation of the HBT, the input voltage forward-biases the base-emitter junction, allowing electrons from the n-type emitter to enter the base. The injected electrons travel across the base by diffusion or drift, and are swept into the collector when they reach the base-collector junction by the high fields in this region. In a homojunction bipolar transistor there is a flow of holes from the base into the emitter across the forward biased base-emitter junction. To suppress the reverse hole injection, the base doping is made lower than that of the emitter. This, however, makes the base layer more resistive, thereby increasing the device's overall base resistance and degrading its bandwidth. In an HBT, by contrast, a wide-bandgap emitter material is used that creates a higher energy barrier for hole injection into the emitter than the barrier to electron flow into the base, thereby automatically suppressing the base current that is due to hole injection. The doping of the base layer can be made as large as possible from solid state chemistry considerations, and the base resistance is correspondingly reduced.

To achieve the high base dopings necessary for RF performance, typically $5-10 \times 10^{19}$ cm$^{-3}$, beryllium is widely used as the p-type base dopant for npn HBTs. A significant reliability issue with such devices is that the electric currents and fields generated at the base-emitter junction cause Be to diffuse from the base into the emitter. This movement of Be is characterized by an increase in the emitter-base turn-on voltage as the electrical junction (defined as the location where the Be doping from the base meets the emitter doping) is pushed further into the emitter. The Be penetration leads to decreased gain, and eventually to complete failure of the transistor. This degradation mechanism is currently the operating rate limiting failure mechanism of npn AlInAs/GaInAs HBTs.

One approach to solving the Be diffusion problem uses an undoped layer of low bandgap material, such as GaInAs or GaAs about 100–500 Angstroms thick, between the wide bandgap emitter and the low bandgap base. The undoped layer acts as a buffer region into which the base Be can diffuse, so that the bulk of the diffusing Be does not reach the emitter. This technique is described in Malik et al., "High-gain, high frequency AlGaAs/GaAs graded band-gap base bipolar transistors with a be diffusion set back layer in the base", Applied Physics Letters, Vol. 46, No. 6, pages 600–602 (1985), and in Jalali et al., "New ideal lateral scaling in abrupt AlInAs.InGaAs heterostructure bipolar transistors prepared by molecular beam epitaxy", Applied Physics Letters, Vol. 54, No. 23, pages 2333–2335 (1989). Undoped setback or spacer layers of base material between the base and emitter are also disclosed in Jensen et al., "AlInAs/GaInAs HBT Ic Technology", IEEE Journal of Solid-State Circuits, Vol. 26, No. 3, March 1991, pages 415–421, and in Nottenburg et al., "InP-Based Heterostructure Bipolar Transistor", Proc. of the 1989 GaAs IC Symposium, 1989 pages 135–138. The setbacks, however, simply increase the distance that Be must diffuse before it penetrates into the emitter, and do not act to actually inhibit the Be movement. Furthermore, the electron transit time through the material increases with the width of the setback layer, and this in turn slows the speed of the HBT.

As the present invention employs a form of graded superlattice between the base and emitter to block Be diffusion, it would be helpful to briefly review the graded superlattice structure. Graded superlattices have previously been used to eliminate the interface pile-up effect of holes in a "high-low" InP/GaInAs avalanche photodiode (Capasso et al., "Pseudo-quaternary GaInAsP semiconductors: A new $Ga_{0.47}In_{0.53}As$/InP graded gap superlattice and its applications to avalanche photodiodes", Applied Physics Letters, Vol. 45, No. 11, Dec. 1, 1984, pages 1193–1195), and to minimize the effect of carrier trapping at the AlInAs/GaInAs interface of a metal-semiconductor-metal photodiode (Wada et al., "Very high speed GaInAs metal-semiconductor-metal photodiode incorporating an AlInAs/GaInAs graded superlattice", Applied Physics Letters, Vol. 54, No. 1, 2 January, 1989, pages 16–17). They consist of a series of layer pairs interfacing between first and second material, with each pair having one layer of the first material and another layer of the second material. Although the total pair thickness generally remain uniform, the thickness of each of the two layers varies from pair to pair. At the end of the superlattice adjacent the first material, the thickness of the layer formed from that material is at a maximum, while the thickness of the second material layer is minimum. These thicknesses are graded across the superlattice, so that at its opposite end the thickness of the first material layer is at a minimum and the thickness of the second material layer is at a maximum.

Graded superlattices have not previously been used in an HBT to block the diffusion of a base dopant. In Won et al., "Self-Aligned $In_{0.52}Al_{0.48}As/In_{0.53}Ga_{0.47}As$ Heterojunction Bipolar Transistors with Graded Interface on Semi-Insulating InP Grown by Molecular Beam Epitaxy", IEEE Electron Device Letters, Vol. 10, No. 3, March 1989, pages 138–140, a graded interface is provided between the base and emitter that makes a linear and continuous transition from the base to the emitter material. This is accomplished in a molecular beam epitaxy (MBE) system by progressively increasing the temperature of the emitter material cell and reducing the temperature of the base material cell as the epitaxial growth from the base to the emitter proceeds. With an InGaAs base and InAlAs emitter, compositional grading of a base-emitter interface was achieved by simultaneously raising the Al and lowering the Ga cell temperatures, while keeping the total Group III flux constant. Graded interfaces of this type have been used to avoid conduction spikes at the base-emitter junction, and thus enhance charge transport and current gain, but do not solve the Be diffusion problem. Furthermore, it is difficult to cool the cell for the base material fast enough for a typical MBE growth rate of 100 Angstroms per minute; with typical cell temperatures of about 1,040° C. for Al and 880° C. for Ga, it would be necessary to reduce the cell temperature by about 100° C. to reduce the flux from that cell by 90%.

In Asbeck et al., "InP-based Heterojunction Bipolar Transistors: Performance Status and Circuit Applications", *Second Int'l. Conf. on Indium Phosphide and Related Materials*, Apr. 23-25, 1990, pages 2-5, a short period superlattice was formed between an AlInAs emitter and a GaInAs base. The superlattice consisted of four sections, with each section having four identical periods; each period had a thickness of 12 Angstroms. In the first section adjacent the emitter, the four periods each had AlInAs and GaInAs layers with widths in the ratio 4:1; the width ratio was reduced to about 3:2 for each of the identical periods in the second section, to about 2:3 for the identical periods in the third section, and to about 1:4 for the identical periods in the fourth section closest to the base. This type of superlattice was proposed as an alternative to a continuous grading, because of problems in the precise control over the continuous grading process. There was no claim to any reduction in the field-enhanced diffusion of Be from the base, and in fact the present invention has found the Asbeck et al. superlattice structure to not be oriented towards a reduction of Be diffusion. The very narrow widths of the minority material layers in the sections at each end of the superlattice, on the order of 1.25 Angstroms, have not been found to be effective in reducing Be diffusion. Since a reduction in Be diffusion is a well known and important goal for an HBT with this type of material system, the lack of any reference to such a reduction indicates that no significant reduction in Be diffusion actually occurred.

SUMMARY OF THE INVENTION

The present invention seeks to provide an npn HBT with a Be-doped base, in which the field-enhanced diffusion of Be from the base into the emitter is greatly reduced or totally eliminated during normal operation.

This goal is achieved by inserting a superlattice between the HBT emitter and base in which the thicknesses of the base and emitter material layers in each superlattice period change in discrete steps for each successive period. The thickness of each period is at least about 20 Angstroms and the superlattice includes more than five periods; its total thickness is preferably restricted to not more than about 400 Angstroms. With this type of structure, the base Be dopant sees multiple material interfaces that are thick enough to effectively prevent Be diffusion from reaching the emitter. To establish an electrical junction at a desired location within the superlattice, the superlattice periods on the base side of the junction are doped p type and the superlattice on the emitter side of the junction are doped n type.

The described superlattice alters the electric field to which the Be is exposed in a manner that effectively inhibits Be diffusion into the emitter. The result is a reliable HBT that is not subject to gain degradation or catastrophic failure during operation.

These and other features and advantages of the invention will be apparent to those skilled in the art from the following detailed description, taken together with the accompanying drawings.

DETAILED DESCRIPTION OF THE INVENTION

The present invention will be described in terms of an HBT with an AlInAs emitter and a GaInAs base. However, it should be understood that it is applicable to other emitter/base combinations that can be used for an npn HBT with Be base doping, such as AlGaAs/GaAs, GaAs/GaInP and InP/GaInAs. The device stability and reliability achieved with the invention make it applicable to virtually all circuits and systems employing HBTs, although the enhanced reliability is particularly important for applications such as space qualified parts like voltage controlled oscillators, high power microwave amplifiers and selected linear integrated circuits for signal processing applications. In addition, since Be diffusion is a kinetically activated process that is greatly accelerated at higher temperatures, enhanced reliability and stability are even more difficult to achieve in hot environments (100°-200° C.) such as those found in automobile engine compartments; the invention also has applications in these areas.

Figures 1, 2:
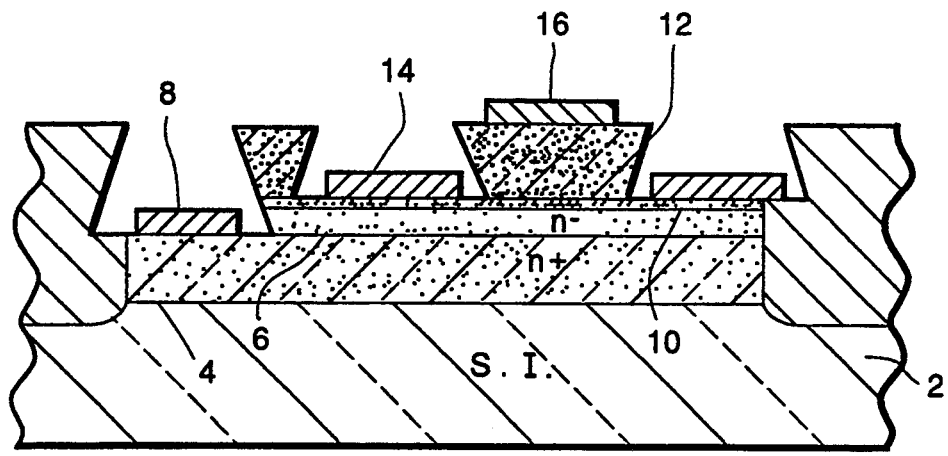
FIG. 1 is a sectional view of a known HBT, described above.
FIG. 2 is a material diagram of an HBT with a base-emitter superlattice in accordance with the invention.

An example of an HBT fabricated in accordance with the invention is shown in FIG. 2. The device is preferably formed by MBE on an InP substrate 18, with a 100 Angstrom GaInAs undoped buffer layer 20 over the substrate and then in succession a 7,000 Angstrom GaInAs subcollector layer 22 with an n doping of $1 \times 10_{19}$ cm$^{-3}$, a 3,000 Angstrom GaInAs collector layer 24 with an n doping concentration of $1 \times 10^{16}$ cm$^{-3}$, and a 500 Angstrom GaInAs base layer 26 with a p doping concentration of $3 \times 10^{19}$ cm$^{-3}$. For purposes of the invention, the p doping is established with Be. Carbon is an alternate dopant with MBE fabricated devices, but it is more difficult to activate. Also, since carbon exhibits considerably less diffusion out of the base than does Be, the ability to arrest base dopant diffusion that is provided by the invention is not particularly applicable to a carbon dopant. Any desired n dopant, such as silicon, can be used for the collector.

An optional 100 Angstrom spacer layer 28, formed from the same material as the base but with a substantially lower Be dopant concentration (such as $2 \times 10^{18}$ cm$^{-3}$), may be provided on top of the base layer 26, followed by a superlattice 30 in accordance with the invention. The purpose of the spacer layer 28, which may be considered to be part of the base for purposes of the present invention, is to provide a region of lower dopant concentration that facilitates a precise location of the base-emitter electrical junction within the superlattice. The use of a lightly doped spacer layer of this type is addressed in copending application Ser. No. 08/007,705 by Metzger et al., "Electrical Junction Device With Lightly Doped Buffer Region to Precisely Locate a P-N Junction", filed on the same date as the present application and also assigned to Hughes Aircraft Company. While the use of a spacer layer of this type is preferred, it is not essential to the invention.

To complete the transistor structure, a 1,200 Angstrom AlInAs emitter layer 32 is formed on top of the superlattice 30 with an n doping concentration of $8 \times 10^{17}$ cm$^{-3}$, followed in succession by a 700 Angstrom AlInAs emitter contact layer 34 and a 1,000 Angstrom GaInAs contact layer 36; both contact layers have an n doping concentration of $1 \times 10^{19}$ cm$^{-3}$.

Figure 3:
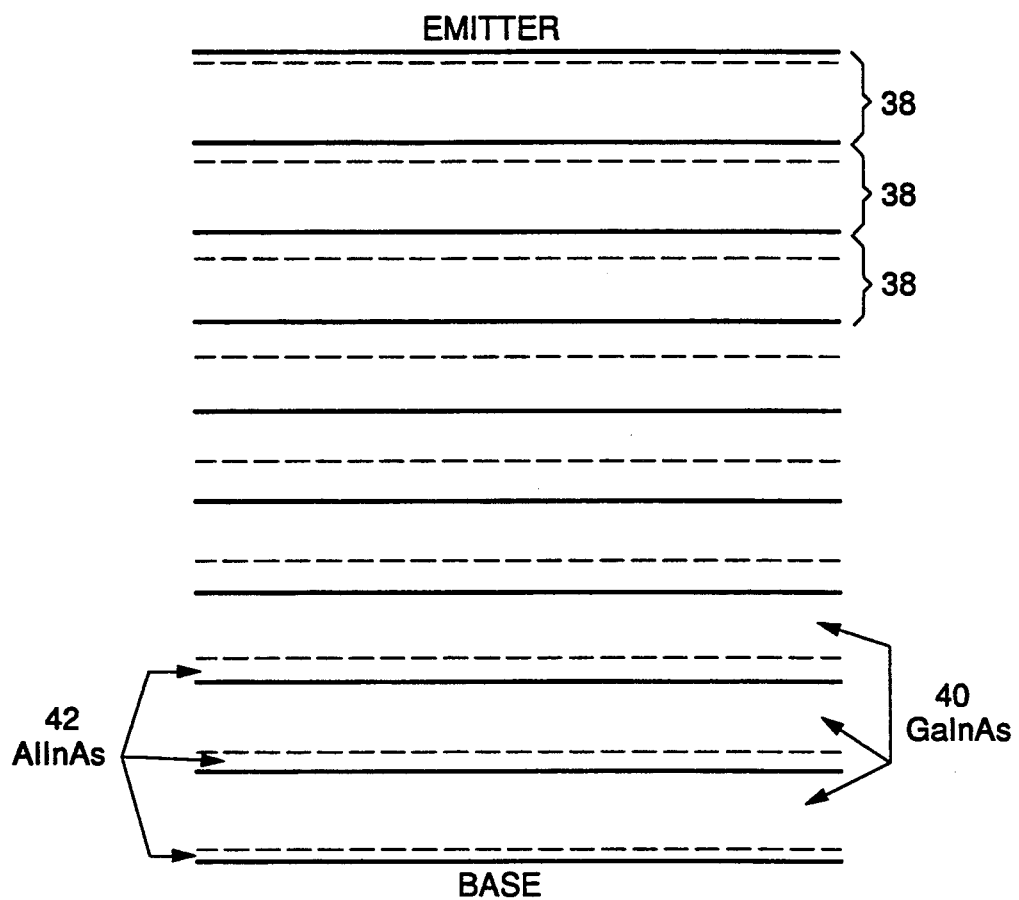
FIG. 3 is an enlarged structural diagram of a superlattice that can be employed for the HBT of FIG. 2.

The superlattice structure is shown in FIG. 3. It consists of successive periods 38, with each period including a first layer 40 of GaInAs base material and a second layer 42 of AlInAs emitter material. The periods most conveniently have equal thicknesses, but this is not essential. To obtain the benefits of the invention, more than five periods are used; nine periods are present in the example of FIGS. 2 and 3. Beginning from the side of the superlattice adjacent to the base, the first period has a very thin layer 42 of emitter material and a much thicker layer 40 of base material. The thicknesses of the two layers are altered in discrete steps for each successive period, with the thickness of the emitter material layer progressively increasing and that of the base material layer progressively decreasing. By the time the last period 38 is reached, adjacent to the emitter, the layer 40 of base material is very thin and the layer 42 of emitter material is much thicker.

The mechanism that causes a diffusion of Be out of the base while an HBT is operating is not well understood, but it can be characterized as a very sensitive function of the electric field within the emitter-base region. The invention works by perturbing the electric field in this region when the device is operated. Internal electric fields are created at the interface of the base and emitter material layers through the superlattice because of the difference in electronic band structures. The superlattice has been found to block Be diffusion from the base into the emitter, and this is believed to result from a trapping of the Be at the interfaces between the two materials. To accomplish this there must be a sufficient number of interfaces, and the various material layers must be thick enough to be effective in blocking the Be diffusion. Although a firm lower limit to the superlattice layer thicknesses has not been established, the 1.25 Angstrom layer thicknesses which characterize the end sections of the Asbeck et al. superlattice, described above, are believed to be too narrow to be effective in inhibiting Be diffusion out of the base. On the other hand, period thicknesses of about 20 Angstroms or greater, in which the thinner layer is significantly thicker than 1.25 Angstroms, do contribute to a blockage of Be diffusion. It has also been determined that the provision of more than five periods, in which the layer thicknesses for each period are discrete and progressively differ from the layer thicknesses for the preceding periods, will provide enough material interfaces to effectively block the dopant diffusion. While these criteria allow for a significant flexibility in the superlattice design, it is also desirable that the total width of the superlattice be kept to not more than about 400 Angstroms to avoid unduly slowing the HBT's speed of operation.

In the particular example of FIG. 3, in which nine superlattice periods are used, each period is 33.3 Angstroms. Beginning at the base end of the superlattice, the layer 40 of base material is 30.0 Angstroms thick, while the layer 42 of emitter material is 3.3 Angstroms thick. The thicknesses of the base material layers drop in approximately 3.3 Angstrom steps for each successive period, while the thicknesses of the emitter material layers increase by the same amount. Thus, the second and third periods from the base have base material layers of 26.6 and 23.3 Angstroms and emitter material layers of 6.7 and 10.0 Angstroms, respectively, while the superlattice period nearest the emitter has a 3.3 Angstrom base material layer and a 30.0 Angstrom emitter material layer.

While the superlattice does not necessarily have to be doped, leaving it undoped allows for the possibility of the base-emitter electrical junction being formed right at the edge of the emitter, with the Be base dopant moving up to the junction. Doping the emitter side of the superlattice n type and the base side of the superlattice p type establishes the base-emitter electrical junction at a known location. With an abrupt doping transition located closer to the base than to the emitter, the Be base dopant will diffuse up to the transition, but further significant Be diffusion will be blocked by the remainder of the superlattice. In the example shown in FIGS. 2 and 3, the first two periods adjacent the base are p doped to the same concentration as the spacer layer 28 ($2 \times 10^{18}$ cm$^{-3}$), while the remaining seven periods are n doped at the same concentration as the emitter ($8 \times 10^{17}$ cm$^{-3}$). These doping levels are flexible, and can be raised or lowered by approximately an order of magnitude and still preserve a sharp electrical junction. Another advantage of doping the superlattice is that is reduces the resistance between the base and the emitter.

In a demonstration of the invention, eight HBTs as shown in FIGS. 2 and 3 were fabricated on one epitaxial structure, while eight control HBTs where fabricated on another epitaxial structure. The control devices were similar to the test HBTs but no superlattice 30 was provided, they had emitter areas of $2 \times 3$ microns$^2$ as opposed to the test device emitter areas of $2 \times 5$ microns$^2$, and the 100 Angstrom spacer layer 28 was replaced with a 150 Angstrom spacer layer that was grown along with the base by MBE at a low temperature of 300° C. This low growth temperature has been found to inhibit the diffusion of Be out of the base during the device growth process, as described in copending patent application Ser. No. 08/007,427 "Heterojunction Bipolar Transistor Fabrication Method With Low Temperature Base Growth", filed on the same day as the present application by the present inventors and also assigned to Hughes Aircraft Company. Any Be diffusion noted in the control devices could therefore be attributed to diffusion during operation, rather than to the device fabrication. All of the devices were operated with a zero collector-base voltage; the collector-emitter voltages were 1.5 volts for the control devices and 1.0 volts for the test devices.

All of the devices were electrically verified as not having growth-related Be outdiffusion into their emitter regions by measuring the turn-on voltage of the emitter-base junction to determine the Be position. Initial measurements showed that there was no Be penetration into the emitter region in either the test or the control devices, indicating that there had been no Be diffusion due to thermal effects during MBE growth.

The two sets of HBTs were then assembled for accelerated lifetest experiments at elevated ambient temperatures, which accelerate the movements of Be, and under a forward current drive to generate an electric field. Any movement of Be could be detected as an increase in the emitter-base turn-on voltage. Only 1 Angstrom of Be penetration would be expected to increase the emitter-base turn-on voltage by 1.8 mV.

Figure 4:
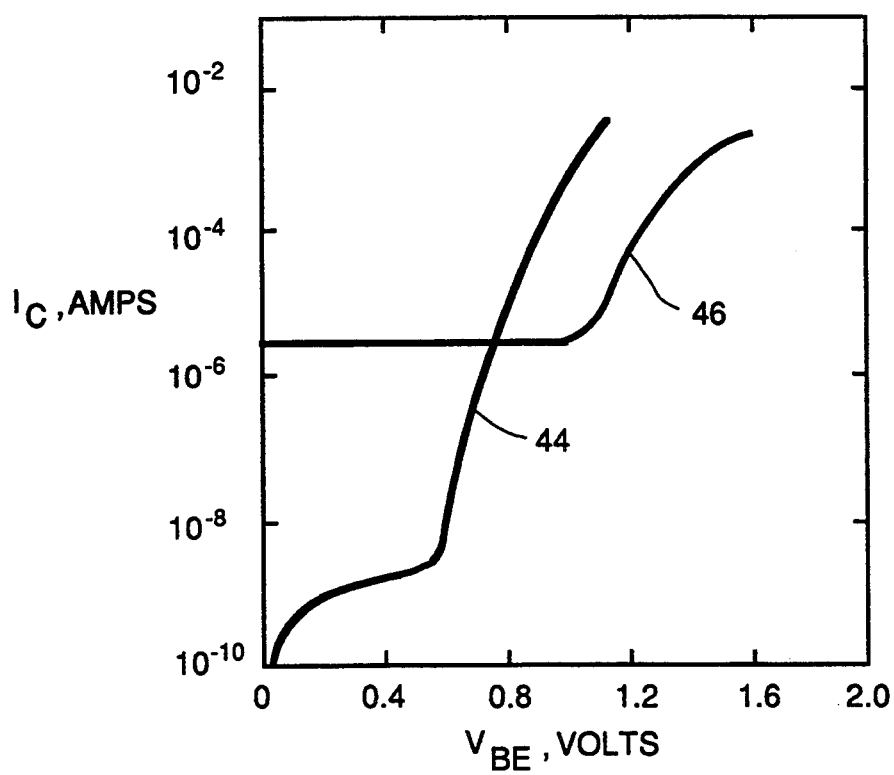
FIGS. 4 and 5 are current-voltage graphs showing the operation of the HBT of FIGS. 2 and 3 respectively without and with the superlattice.

The control samples were held at 180° C. for 48 hours, operating at a current density of $2.5 \times 10^4 \text{amp/cm}^2$ (a typical current operation point for HBTs). Under these conditions the emitter-base turn-on voltage increased by 300 mV, thereby destroying the devices' gain and making them nonfunctional. This result, which indicated an extensive Be penetration, is illustrated in FIG. 4; both the voltage shift after testing and the excessive current for emitter-base voltages below 1.1 volt are shown. Curve 44 shows the control devices' response before the stress was applied, while curve 46 shows the response after the 180° C. stress for 48 hours.

Figure 5:
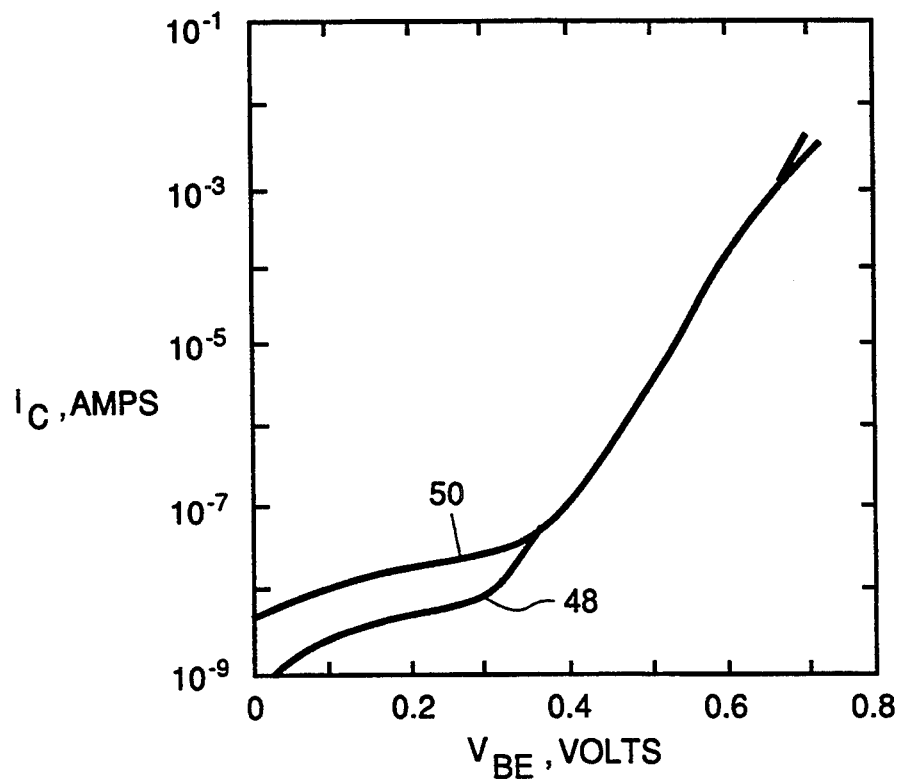

The test HBTs were held at the same current density of $2.5 \times 10^4 \text{amp/cm}^2$ at 200° C. (20° C. hotter than the control samples) for 150 hours (approximately three times longer than the control samples). The results are shown in FIG. 5, in which curve 48 shows the voltage-current characteristic prior to the stress and curve 50 shows the post-stress characteristic. The test samples showed no change in the emitter-base turn-on voltage, thus indicating the absence of Be diffusion. This experiment demonstrated that the discretely graded superlattice stopped the electric field assisted diffusion of Be from the base to the emitter in npn AlInAs/GaInAs HBTs, thereby yielding stable, reliable transistors.

While a particular illustrative embodiment of the invention has been shown and described, numerous variations and alternate embodiments will occur to those skilled in the art. Such variations and alternate embodiments are contemplated, and can be made without departing from the spirit and scope of the invention as defined in the appended claims.

We claim:

1. A gain-stable npn heterojunction bipolar transistor (HBT), comprising:
   a semiconductor base layer that is p-doped with Be,
   an n-doped semiconductor collector layer on one side of said base layer,
   an n-doped emitter layer, formed from a different semiconductor material from said base and collector layers, on the other side of said base layer, and
   a graded superlattice between said base and emitter layers, said superlattice comprising multiple discrete periods with each period having a layer of base material and a layer of emitter material, wherein the thicknesses of the base material layers progressively decrease and the thicknesses of the emitter material layers progressively increase in discrete steps for each successive period from the base to the emitter, and the thickness of each period, the thickness of the thinner layer in each period and the number of periods are selected to effectively prevent Be diffusion from reaching the emitter.

2. The HBT of claim 1, wherein said superlattice is doped to establish an electrical junction within the superlattice, with the superlattice periods on the base side of the junction doped p and the superlattice periods on the emitter side of the junction doped n.

3. The HBT of claim 2, wherein the thickness of each period is at least about 20 Angstroms.

4. The HBT of claim 3, said superlattice comprising more than five periods.

5. The HBT of claim 1, wherein the thickness of each period is at least about 20 Angstroms.

6. The HBT of claim 5, said superlattice comprising more than five periods.

7. The HBT of claim 5, wherein the total thickness of said superlattice is not more than about 400 Angstroms.

8. The HBT of claim 1, said superlattice comprising more than five periods.

9. The HBT of claim 1, wherein the emitter/base materials are selected from AlInAs/GaInAs, AlGaAs/GaAs, GaAs/GaInP and InP/GaInAs.

10. A gain-stable npn heterojunction bipolar transistor (HBT), comprising:
    a semiconductor base layer that is p-doped with Be,
    an n-doped semiconductor collector layer on one side of said base layer,
    an n-doped emitter layer, formed from a different semiconductor material from said base and collector layers on the other side of said base layer, and
    a graded superlattice between said base and emitter layers, said superlattice comprising multiple discrete periods with each period having a layer of base material and a layer of emitter material, wherein the thickness of each period is at least about 20 Angstroms, wherein the thicknesses of the base material layers progressively decrease and the thicknesses of the emitter material layers progressively increase in discrete steps for each successive period from the base to the emitter, and the thickness of each period, the thickness of the thinner layer in each period and the number of periods are selected to effectively prevent Be diffusion from reaching the emitter.

11. The HBT of claim 10, wherein said superlattice is doped to establish an electrical junction within the superlattice, with the superlattice periods on the base side of the junction doped p and the superlattice periods on the emitter side of the junction doped n.

12. The HBT of claim 11, said superlattice comprising more than five periods.

13. The HBT of claim 12, wherein the total thickness of said superlattice is not more than about 400 Angstroms.

14. The HBT of claim 10, said superlattice comprising more than five periods.

15. A gain-stable npn heterojunction bipolar transistor (HBT), comprising:
    a semiconductor base layer that is p-doped with Be,
    an n-doped semiconductor collector layer on one side of said base layer,
    an n-doped emitter layer, formed from a different semiconductor material from said base and collector layers on the other side of said base layer, and
    a graded superlattice between said base and emitter layers, said superlattice comprising more than five discrete periods, with each period having a layer of base material and a layer of emitter material, wherein the thicknesses of the base material layers progressively decrease and the thicknesses of the emitter material layers progressively increase in discrete steps for each successive period from the base to the emitter, and the thickness of each period, the thickness of the thinner layer in each period and the number of periods are selected to effectively prevent Be diffusion from reaching the emitter.

16. The HBT of claim 15, wherein said superlattice is doped to establish an electrical junction within the superlattice, with the superlattice periods on the base side of the junction doped p and the superlattice periods on the emitter side of the junction doped n.

17. The HBT of claim 15, wherein the total thickness of said superlattice is not more than about 400 Angstroms.

* * * * *